United States Patent
Durocher et al.

(10) Patent No.: US 7,517,785 B2
(45) Date of Patent: Apr. 14, 2009

(54) ELECTRONIC INTERCONNECTS AND METHODS OF MAKING SAME

(75) Inventors: Kevin Matthew Durocher, Waterford, NY (US); James Wilson Rose, Guilderland, NY (US)

(73) Assignee: General Electric Company, Niskayuna, NY (US)

( * ) Notice: Subject to any disclaimer, the term of this patent is extended or adjusted under 35 U.S.C. 154(b) by 342 days.

(21) Appl. No.: 11/255,489

(22) Filed: Oct. 21, 2005

(65) Prior Publication Data

US 2007/0093049 A1    Apr. 26, 2007

(51) Int. Cl.
*H01L 21/44*    (2006.01)
(52) U.S. Cl. ............ 438/612; 257/E21.59; 257/E23.02; 438/652; 438/669; 438/674
(58) Field of Classification Search ................. 438/656, 438/612, 652, 669, 674; 257/E23.02, E21.59
See application file for complete search history.

(56) References Cited

U.S. PATENT DOCUMENTS

| | | | | |
|---|---|---|---|---|
| 5,748,521 A * | 5/1998 | Lee | ............................. | 365/149 |
| 6,117,793 A * | 9/2000 | Tang | ........................... | 438/740 |
| 2002/0020855 A1* | 2/2002 | Hwang | ........................ | 257/200 |
| 2003/0008489 A1* | 1/2003 | Koblis | ........................ | 438/612 |
| 2005/0003607 A1* | 1/2005 | Moxham et al. | ............. | 438/239 |
| 2005/0280157 A1* | 12/2005 | Roush et al. | ................. | 257/773 |

* cited by examiner

*Primary Examiner*—Asok K Sarkar
(74) *Attorney, Agent, or Firm*—Patrick K. Patnode (57) ABSTRACT

A method for making an interconnect is provided. The method includes depositing a conductive layer on a substrate, depositing a protective layer on the conductive layer, patterning the protective layer to form openings to the conductive layer, depositing contact pads on the conductive layer through the openings in the protective layer, the contact pads comprising a conductive material, and patterning the conductive layer and the protective layer to form electrical traces on the substrate.

13 Claims, 7 Drawing Sheets

ELECTRONIC INTERCONNECTS AND METHODS OF MAKING SAME

BACKGROUND

The invention relates generally to the field of electronic packaging, and more particularly to interconnects for electronic packaging and methods of making the same.

Typically, in electronic packaging, bus plating is employed to form interconnects. As will be appreciated, in bus plating, a conductive metal, such as copper, is deposited on a substrate or a board. Subsequently, the conductive layer is patterned to form a series of electrical traces that may include a series of conductive busses across the surface of the substrate. These busses are connected to a power source via a common bus and are used to form electrical connections from the power source to the traces. Subsequent to forming the busses, a patterned mask is formed over certain portions of the traces, while leaving other portions exposed. The contact pads are then formed on the exposed portions of the electrical traces.

As will be appreciated, during formation of traces by patterning the conductive layer, the conductive layer is exposed to the ambient environment and is highly susceptible to oxidization, which generally affects the adhesion of contact pads on the surface. Disadvantageously, poor adhesion between the conductive layer and the contact pads may affect the performance of the packaging in an undesirable manner. For example, poor adhesion may lead to increased resistance between the conductive layer and the contact pads and therefore may result in heating of the electronic packaging. This problem is compounded by recent trends to reduce the size of electronic devices while increasing the density per unit area, thereby increasing the interconnect density on the electronic packages. As a result, the performance of the device is increasingly impacted by limitations in interconnect technology and packaging of the chips used to fabricate the devices.

Accordingly, there is a need to provide improved interconnects for use in electronic packaging.

BRIEF DESCRIPTION

In accordance with one aspect of the present technique, a method for making an interconnect is provided. The method includes depositing a conductive layer on a substrate, depositing a protective layer on the conductive layer, and patterning the protective layer to form openings to the conductive layer. The method further includes depositing contact pads on the conductive layer through the openings in the protective layer. The contact pads may include a conductive material. The method also includes patterning the conductive layer and the protective layer to form electrical traces on the substrate.

In accordance with another aspect of the present technique, a method for making an interconnect is provided. The method includes providing a substrate having a first surface and a second surface, depositing conductive layers on each of the first and second surfaces of the substrate, depositing protective layers on each of the conductive layers, patterning the protective layer to form openings to the conductive layer, depositing contact pads on each of the conductive layers through the openings in the protective layer, and patterning each of the conductive layers to form electrical traces on each of the first and second surfaces of the substrate.

In accordance with yet another aspect of the present technique, an interconnect is provided. The interconnect includes a conductive layer patterned to form a plurality of electrical traces disposed on a substrate, a plurality of contact pads disposed on the conductive layer, and a protective layer disposed on the conductive layer and patterned to only cover the plurality of electrical traces.

In accordance with another aspect of the present technique, a structure is provided. The structure includes a substrate wherein the substrate does not include bus lines routing to a common bus, a conductive layer patterned to form a plurality of electrical traces on the substrate, a plurality of contact pads disposed on the conductive layer, and a protective layer disposed on the conductive layer and patterned to only cover the plurality of electrical traces.

In accordance with yet another aspect of the present technique, an electronic package is provided. The package includes an electric circuit having an interconnect of the present technique.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Typically, in interconnects employed in electronic packaging, electrical traces and contact pads are formed by bus plating. In bus plating, a metal layer is formed on a substrate. This metal layer is then patterned to form electrical traces. A series of conductive electrical bus lines are formed across the surface of the substrate to provide electrical connections to the traces at the locations where contact pads are to be deposited. Subsequently, all the bus lines are connected to a common electrical bus which is external to the circuit. This common electrical bus in turn is connected to a power source.

After connecting the electrical traces to the bus lines, a patterned mask is formed over a portion of the traces, while leaving certain portions exposed for formation of contact pads. Subsequently, conductive layers are plated onto the exposed portions of the electrical traces to form contact pads.

Plating the contact pads using bus plating may result in non-uniform plating of the conductive layers due to local current density. As will be appreciated, plating rate of a contact pad will be affected by the length and the density of the electrical traces connecting to that pad. For example, sparse electrical bus lines may plate faster than a relatively denser group of bus lines. Accordingly, contact pads having long, circuitous connections to bus lines may have a more resistive path, and accordingly plate relatively slowly. As will be appreciated, this change in electrical bus line resistivities may result in non-uniformity of plated areas. Also, plating the contact pads in this manner may result in contact pads having larger dimensions than desirable.

Subsequently, after plating the contact pads, the common electrical bus is then removed by physically separating it from the other electrical bus lines. However, separating the common electrical bus in this manner leaves residual portions of the electrical bus lines on the substrate, which are still electrically connected to the plated contact pads, and extend to the circuit periphery, where they were physically separated from the common electrical bus. The existence of these residual portions requires that remainder of the circuit should accommodate routing around these pathways, which may further complicate the circuit design. Also, these residual portions of the busses may disadvantageously cause signal reflections, and may further degrade the noise performance of the circuit, particularly for high speed traces, which may impair high frequency electrical performance.

Additionally, the metal typically used for forming such traces and pads, such as copper, may get oxidized, thereby resulting in poor adhesion between the contact pad and the underlying electrical traces. Moreover, poor wire-bondability, slow plating process, difficulty in achieving thick plating, and high costs render this process difficult to employ and often undesirable.

Figure 1:
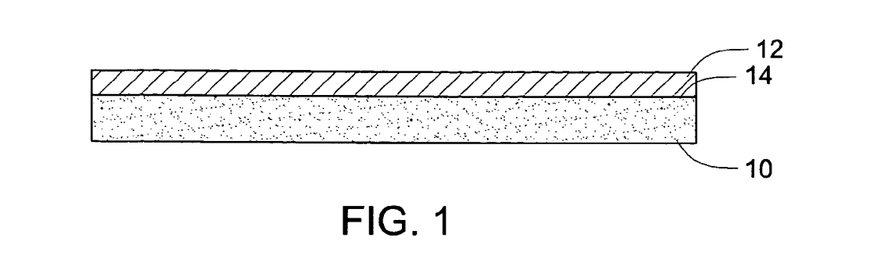
FIGS. 1-10 are diagrammatical representations of various steps involved in an exemplary method for making an interconnect according to certain embodiments of the present technique.

Referring to FIG. 1, a substrate 10 includes a conductive layer 12 over a surface 14. In certain embodiments, the substrate 10 may include a flexible material, a printed wiring board, a semiconductor wafer, a glass substrate, a pyrex substrate, or a metal substrate. As used herein, the term "flexible" generally means being capable of being bent into a shape having a radius of curvature of less than approximately 100 cm.

In certain embodiments, the conductive layer 12 may be deposited on the substrate 10 by employing any suitable deposition techniques, such as physical vapor deposition, plasma-enhanced chemical-vapor deposition (PECVD), radio-frequency plasma-enhanced chemical-vapor deposition (RFPECVD), expanding thermal-plasma chemical-vapor deposition (ETPCVD), reactive sputtering, electron-cyclodrawn-residence plasma-enhanced chemical-vapor deposition (ECRPECVD), inductively coupled plasma-enhanced chemical-vapor deposition (ICPECVD), sputter deposition, evaporation, atomic layer deposition (ALD), or combinations thereof.

In some embodiment, the conductive layer 12 may include conductive material, such as copper, or nickel, or both. In certain embodiments, the thickness of the conductive layer 12 may be in a range from about 5 microns to about 20 microns, and preferably from about from about 10 microns to about 15 microns. In one embodiment, the thickness of the conductive layer is about 10 microns.

Additionally, in some embodiments, an adhesion promoting coating (not shown) may be deposited on the surface 14 of the substrate 10 prior to the deposition of the conductive layer 12. In an exemplary embodiment, the adhesion promoting coating may include chromium, titanium, nickel, a nickel alloy, tungsten, molybdenum, or combinations thereof. As will be appreciated, Monel™ is a nickel alloy having about 65 weight percent to about 70 weight percent nickel, about 20 weight percent to about 29 weight percent copper, and small amounts of iron, manganese, silicon, and carbon. In one embodiment, the adhesion promoting coating may include titanium. Additionally, the surface 14 of the substrate 10, which is to receive the conductive layer 12, may be subjected to surface treatments to enhance the adhesion between the substrate 10 and the conductive layer 12 by increasing the surface area of the surface 14 of the substrate 10. In some embodiments, the surface treatments may include, metal sputtering, etching, plasma etching, dehydration baking, mechanical roughening, grinding, or combinations thereof.

Figure 2:
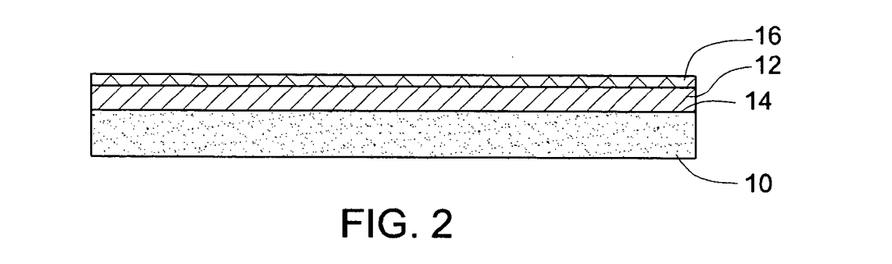

Next, as illustrated in FIG. 2, a protective layer 16 is deposited on the conductive layer 12. In certain embodiments, the protective layer 16 may be employed to prevent the conductive layer 12 from oxidizing while forming the electrical traces, and contact pads on the substrate 10. In certain embodiments, the protective layer 16 may include a material that is electrically conductive. In these embodiments, the material of the protective layer 16 may have a relatively higher oxidation potential as compared to the material employed in the conductive layer 12. For example, the protective layer 16 may employ titanium, tungsten, nickel, a nickel alloy, molybdenum, chromium, or combinations thereof. In these embodiments, the thickness of the protective layer may vary in a range from about 0.05 microns to about 0.5 microns, and preferably in a range from about 0.1 microns to about 0.4 microns.

Further, in some embodiments, the protective layer 16 may include a plurality of layers. In these embodiments, the various layers of the protective layer 16 may be subsequently deposited on the conductive layer 12. For example, the protective layer 16 may be deposited by forming a titanium layer on the conductive layer 12 followed by a deposition of a molybdenum layer on the previously deposited titanium layer. In certain embodiments, the protective layer 16 may be deposited on the conductive layer 12 by using techniques similar to those used for depositing the conductive layer 12.

Figure 3:
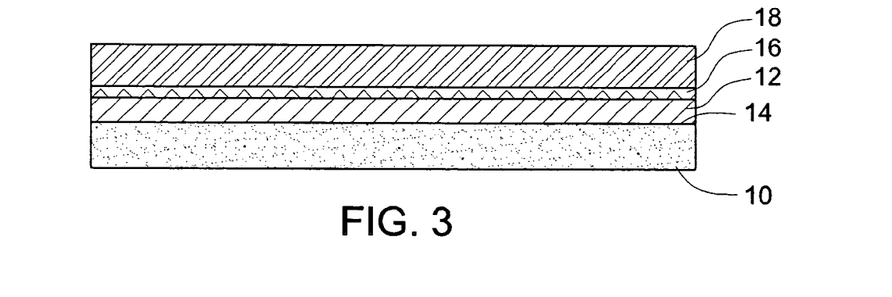

Subsequently, the protective layer 16 is patterned to form openings to the conductive layer 12. In certain embodiments, the protective layer 16 may be patterned by employing processes such as, lithography or direct write. In the embodiments where lithography is employed to form patterns on the protective layer 16, as illustrated in FIG. 3, a pattern transfer mask 18 is disposed on the protective layer 16. In certain embodiments, the pattern transfer mask 18 may be configured to form patterns by employing processes, such as photolithography. In these embodiments, photolithography may be employed to create patterns in the pattern transfer mask and then subsequently transferring these patterns onto the underlying layer, such as the protective layer 16.

In certain embodiments, the pattern transfer mask 18 may include a photoresist, such as a dry film photoresist, liquid photoresist, or electrophoretic photoresist. As will be appreciated, a photoresist is a light sensitive coating that may be applied to a surface, which is to be patterned. The photoresist may be deposited on the underlying layer to resist the action of the etchant or an etching solution to produce desirable pattern in the layer. In some embodiments, the photoresist may be in the form of a dry film, such as an organic coating, or a may be in the form of a liquid which may be spin coated onto the layer that is to be patterned.

As will be appreciated, a photo-mask may be employed to define the areas of the photoresist that may be exposed to light. In case of a positive photoresist, these exposed areas may subsequently be removed by a medium, such as a solvent, thereby leaving the desirable pattern on the surface of the metal layer. Alternatively, in case of a negative photoresist, the un-exposed portions may be removed by a solvent, thereby leaving the exposed portions on the surface of the metal layer in the form of a pattern.

Alternatively, an electrophoretic resist may be employed in the pattern transfer mask 18. As will be appreciated, an electrophoretic resist may include an organic chemical which may be deposited on the metal layer to be patterned by using an electroplating process. Advantageously, electrophoretic resists offer physical robustness, as well as precise patterns upon etching. As with other photoresists, after masking and etching, the electrophoretic resist may be subsequently dissolved in a solvent to produce the desirable pattern.

Figure 4:
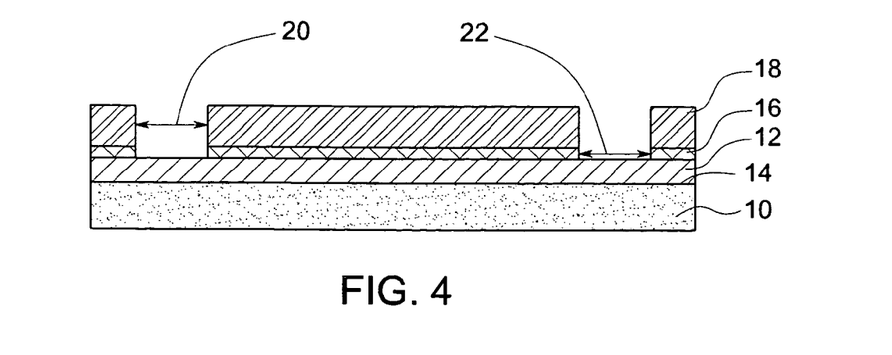

Subsequently, as illustrated in FIG. 4, openings 20 are formed in the pattern transfer mask 18 through one of the processes described above, and the underlying protective layer 16 may be etched to form openings 22 to the conductive layer 12 as illustrated. The openings 20 are formed at locations where the contact pads are to be deposited on the conductive layer 12.

Although not illustrated, in alternate embodiments, a direct write process may be employed with a resist to form patterns or openings, such as openings 22, in the protective layer 16. In an exemplary embodiment, an inverted direct write process may be employed with a negative resist. In this embodiment, the inverted direct write process may be employed to deposit the negative resist on the protective layer 16 in a pattern that is a mirror or reverse image of a desirable pattern, which is to be formed on the protective layer 16. That is, by employing inverted direct write process, the negative resist may be deposited on portions of the protective layer 16, which are subsequently going to have openings to the conductive layer 12. For example, the negative resist may be deposited on the portions of the protective layer 16 that corresponds to the portions where openings 22 are subsequently formed. As will be appreciated, in a direct write process the motion of a dispensing tool directly defines the resulting pattern. Typically, the thickness of the resist employed in this process is maintained in excess of the targeted plating thickness. This is desirable to retain the pattern shape and integrity. For example, a negative resist having a thickness of about 16 microns may be employed to plate a contact pad having a thickness in a range of about 8 microns to about 12 microns.

Figure 5:
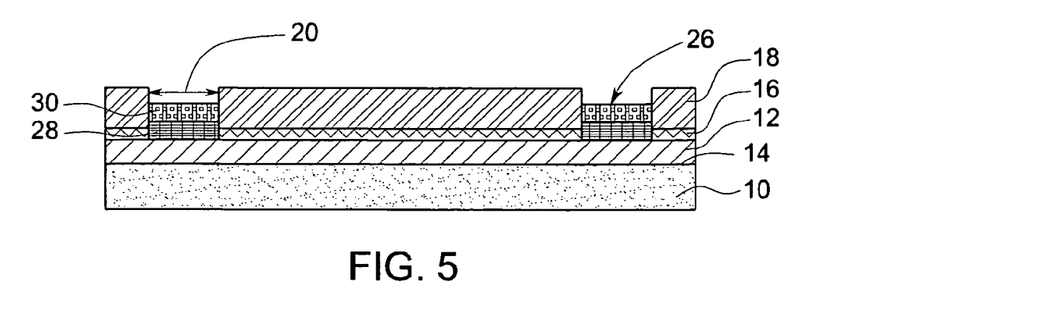

Referring to FIG. 5, subsequent to forming the openings 22 in the protective layer 16, the contact pads 26 are formed in the openings 22 by employing additive plating processes, such as electrolytic plating. In the illustrated embodiment, the contact pads 26 may include two or more layers. In the illustrated embodiment, the contact pads 26 may include a first layer 28 having a first material, and a second layer 30 having a second material. In certain embodiments, the first layer 28 may be deposited on the conductive layer 12 by electrolytic plating. Subsequently, the second layer 30 may be deposited on the first layer 28 by employing electrolytic plating.

In certain embodiments, the first layer 28 may have a barrier metal which may be configured to serve in solder applications. For example, the first layer 28 may include nickel, and the second layer 30 may include gold. The formation of the structure illustrated in FIG. 5 is described further below. In some embodiments, the first material 28 may include any suitable conductive material, such as nickel. In some embodiments, the second layer 30 may include a noble metal, such as gold, or palladium, or both. In an exemplary embodiment, the metal layers may include a nickel layer having a gold layer disposed thereon.

Although not illustrated, in alternate embodiments, the contact pads 26 may be deposited in the openings 22 of the protective layer 16 by employing lithographic techniques. In these embodiments, the metal layers of the contact pads 26, such as metal layers 28 and 30, may be formed on the entire surface of the conductive layer 12, that is, the metal layers 28 and 30 may be formed over the surface of the protective layer 16 and also in the openings 22 in the protective layer 16. Subsequently, a pattern transfer mask may be applied over these metal layers 28 and 30, such that the pattern transfer mask covers the metal layers 28 and 30 at the locations where contact pads 26 are desirable, and the pattern transfer mask has openings at the locations where the contacts pads 26 are not desirable. In other words, the pattern transfer mask for the contacts pads 26 is reverse of the pattern transfer mask 18 employed for patterning the protective layer 16. Subsequently, the metal layers 28 and 30 are etched from the regions other than the regions coinciding with the openings 22 to form contact pads 26 on the conductive layer 12.

Figure 6:
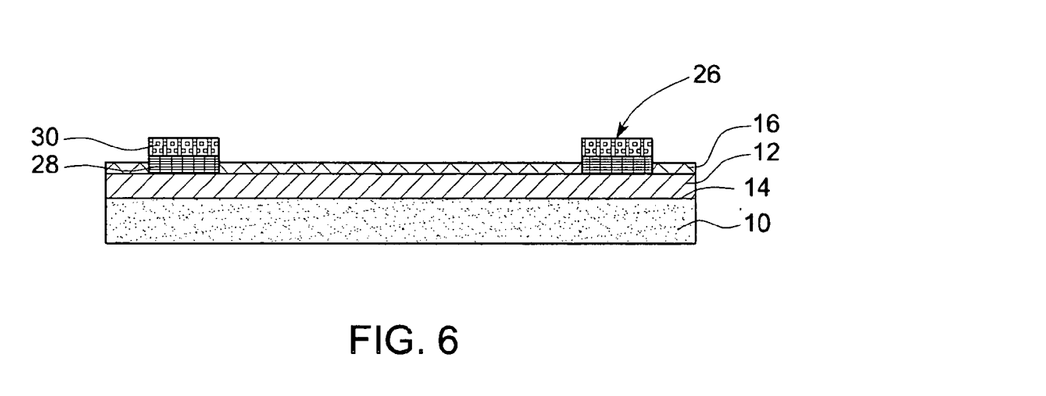

Next, in FIG. 6, the pattern transfer mask, such as mask 18, is removed to provide the contact pads 26 on the conductive layer 12. Further, as with substrate 10, any undesirable substances, such as organic materials, may be removed from the surface of the contact pads 26 and the protective layer 16. In an exemplary embodiment, the surface of the protective layer 16 and the contact pads 26 may be cleaned by employing processes, such as plasma etching or sputtering.

Subsequent to forming the contact pads 26 on the conductive layer 12 through the openings 22 in the protective layer 16, the electrical traces (not shown) may be formed by employing one or more pattern transfer mask layers and using the lithographic techniques described above.

Figure 7:
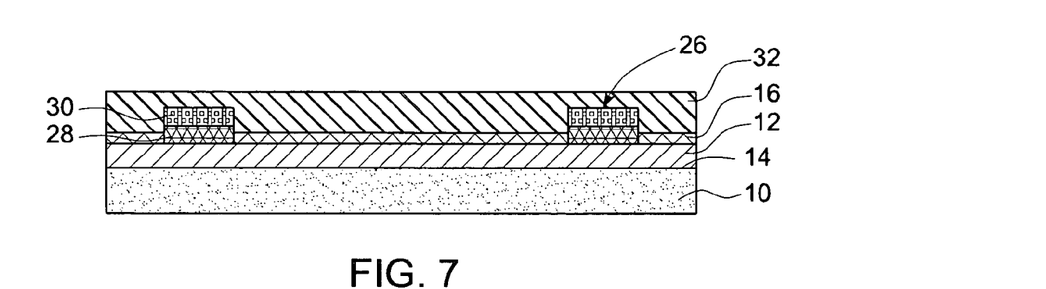
Figure 8:
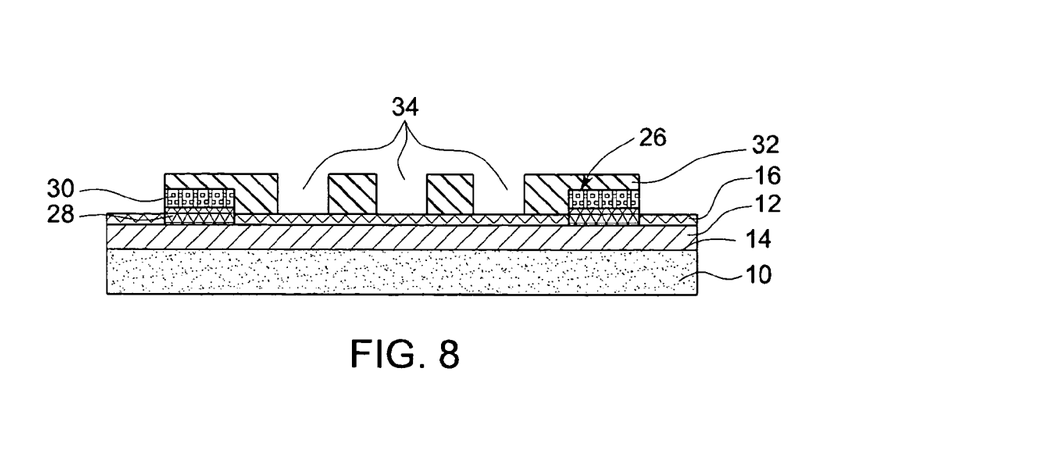

Referring to FIG. 7, a cross-sectional view of the substrate 10 employing a pattern transfer mask 32 is illustrated. As with the pattern transfer mask 18 of FIGS. 3-5, in an exemplary embodiment, the pattern transfer mask 32 may include a photoresist, such as a dry photoresist, a liquid photoresist, or an electrophoretic photoresist. Further, in FIG. 8, the mask 32 is patterned to generate openings 34, where the conductive and the protective layers 12 and 16 are to be etched to form desirable patterns.

Figure 9:
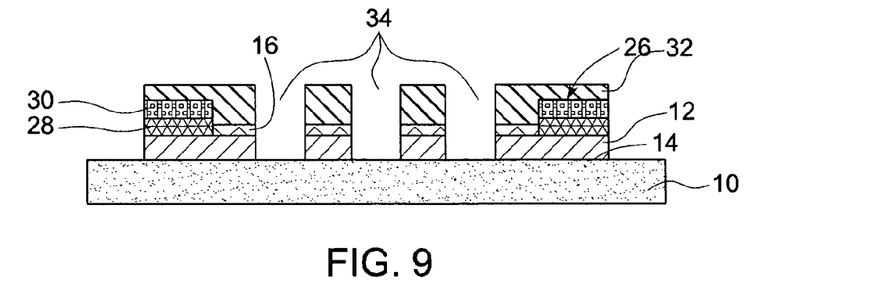

Subsequently, as illustrated in FIG. 9, portions of the protective layer 16 and the conductive layer 12 are removed from these openings 34. In an exemplary embodiment, the conductive layer 12 is removed from the openings 34 by etching away the metal. In some embodiments, the etchants may include a buffered hydrofluoric acid, such as a TFT, or ferric chloride, or both. In an exemplary embodiment, a sequence of etching may be employed to etch the conductive and the protective layers 12 and 16. For example, the regions in the openings 34 may be first etched with TFT, followed by ferric chloride, and again with TFT, to remove the two layers 12 and 16. In one embodiment, where copper is employed in the conductive layer 12, the use of ferric chloride as an etchant facilitates etching of the conductive layer. In one embodiment, where titanium is employed as the protective layer and/or the adhesion promoting layer between the substrate 10 and the conductive layer 12, TFT may be used to etch one or both of the titanium layers. In alternate embodiments, reactive ion etching (RIE) may be employed to etch the conductive layer 12 from the openings 34. In these embodiments, etch chemistries using a gas mixture of tetrafluoromethane and argon may be employed in the RIE process.

Figure 10:
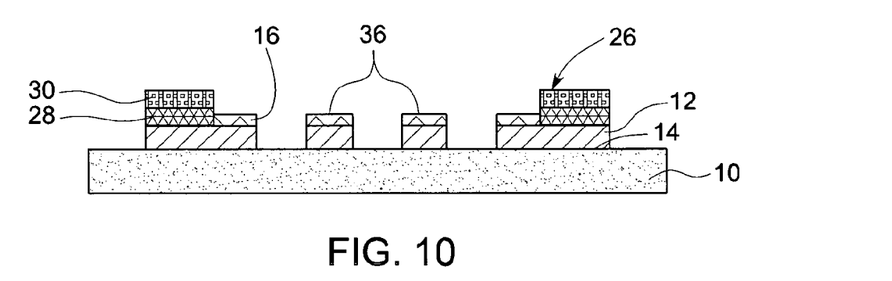

Subsequently, as illustrated in FIG. 10, the pattern transfer mask 32 (not shown) is removed to provide a substrate 10 having a plurality of electrical traces 36 having protective layer 16 disposed thereon, and a plurality of contact pads 26 disposed on the conductive layer 12.

Figure 11:
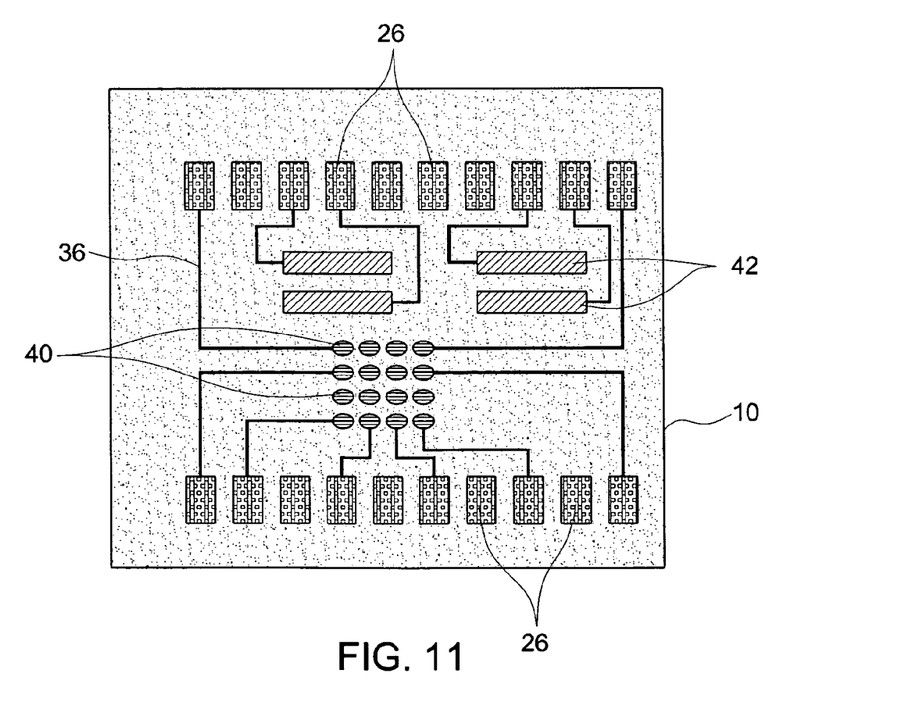
FIG. 11 is a top view of an exemplary interconnect fabricated in accordance with the exemplary method described with reference to FIGS. 1-10.

FIG. 11 is a top view of the electronic package of FIG. 10 employing a plurality of electrical traces 36 and contact pads 26. As illustrated, the substrate 10 includes contact pads 26, electrically connected to ball grid array (BGA) pads 40 by electrical traces 36. As will be appreciated, a BGA package includes a grid of solder balls that may be coupled to the BGA pads, such as the pads 40, and employed as electrical connectors between the chip and the electronic device. Advantageously, the BGA contacts result in compact size, high current carrying capability while maintaining low inductance, thereby resulting in low resistance. Also, BGAs are relatively easier to align to the printed circuit boards, because the leads, which are called "solder balls" or "solder bumps", are farther apart than the leaded packages of wire bonds. Further, the substrate 10 may include soldering pads 42 to receive electronic devices on the substrate 10.

In certain embodiments, the substrate 10 may not include the bus lines. Further, the substrate 10 may not include the bus lines that route to a common bus. In other words, in the illustrated embodiment, the electrical traces 36 may not extend to form an electrical bus as in prior techniques. Therefore, as illustrated in FIG. 10, there may not be any residual portions of the bus lines on the substrate, which may be disposed in between the plurality of electrical traces 36.

In certain embodiments, the electronic package having the interconnect fabricated by employing the method as discussed above, with reference to FIGS. 1 to 10, may be employed in an ultrasound detector, or a computer tomography detector. Advantageously, the absence of bus lines or the residual of bus lines, may result in enhanced performance of the detectors in terms of signal to noise ratio and resulting image quality.

In certain embodiments, the electronic package may include a flip chip configuration, or a chip-on-board configuration, or both. As will be appreciated, a flip chip is a method of chip packaging where the active side, that is, the side having the circuit elements, of the chip is flipped over facing towards the electronic device or the die. Therefore, instead of facing up and bonded to the package leads with wires from the outside edges of the chip, any portion of the surface area of the flip chip may be used for interconnection. This interconnection may be provided through metal bumps of solder, copper, nickel, or gold.

As will be appreciated, the chip-on-board configuration may include a chip mounted on a printed circuit board. Further, the chip may be adhered and wire bonded, or tape automated bonding (TAB), or flip-chip bonding, to the board.

FIGS. 12-22 illustrates various steps involved in an exemplary method for making an interconnect for an electronic package, according to alternate embodiments of the present technique.

Figure 12:
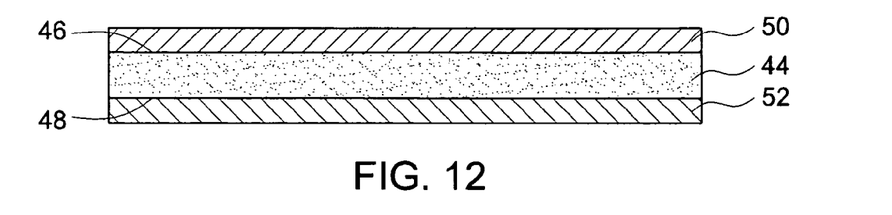
FIGS. 12-21 are diagrammatical representations of various steps involved in another exemplary method for making an interconnect according to certain embodiments of the present technique.

Referring to FIG. 12, a substrate 44 having a first surface 46 and a second surface 48 is illustrated. In the illustrated embodiment, the substrate 44 employs conductive layers 50 and 52 on the first and second surfaces 46 and 48, respectively. The conductive layers 50 and 52 may be deposited on the substrate 44 by employing techniques as described above with regard to the conductive layer 12 of FIG. 1. In certain embodiments, the thickness of the conductive layers 50 and 52 may be in a range from about 5 microns to about 20 microns, and preferably in a range from about 10 microns to about 15 microns. Further, as with conductive layer 12 (see FIG. 1), the conductive layers 50 and 52 may employ copper, or nickel, or both. Although not illustrated, through-thickness openings may be formed in the substrate 44 along with the conductive layers 50 and 52. These through-thickness openings may be formed by drilling, and may be utilized to form vias.

Figure 13:
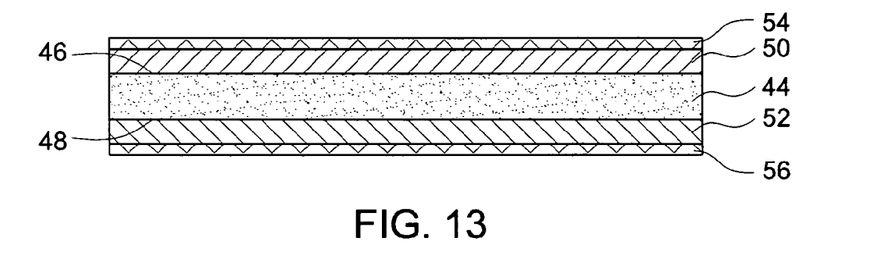

Further, protective layers 54 and 56 are disposed on the conductive layers 50 and 52. The protective layers 54 and 56 may be similar to the protective layer 16, previously described with regard to FIG. 2. In some embodiments, the protective layers may be deposited by employing deposition techniques similar to those used for depositing conductive layers 50 and 52. Further, the thickness of the protective layers 54 and 56 may be in a range from about 0.05 microns to about 0.5 microns, and preferably in a range from about 0.1 microns to about 0.4 microns.

Figure 14:
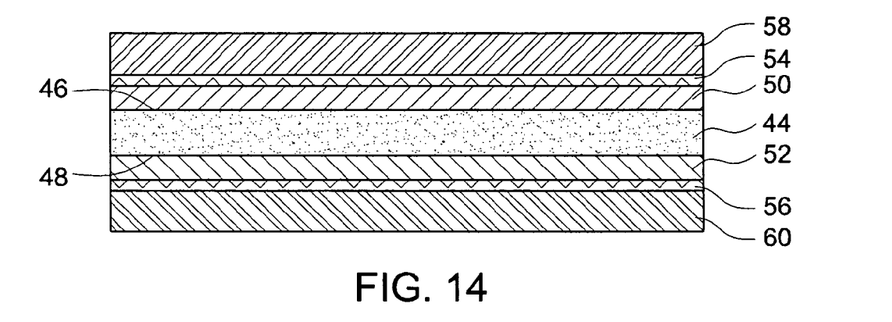
Figure 15:
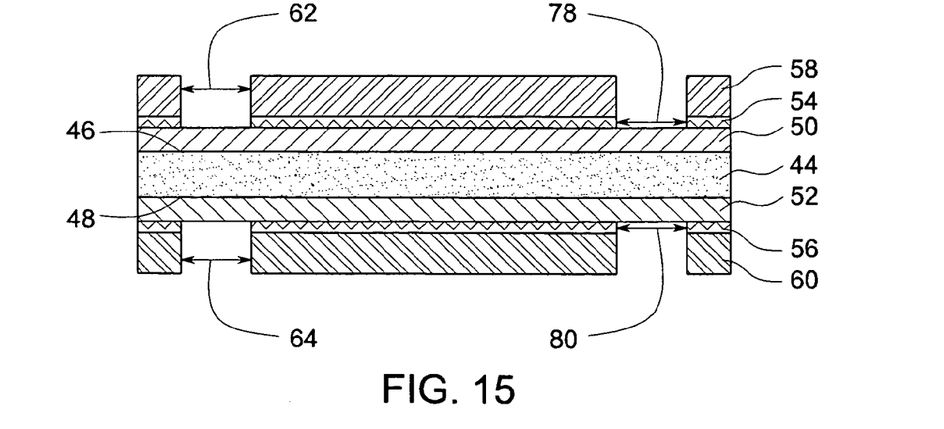
Figure 16:
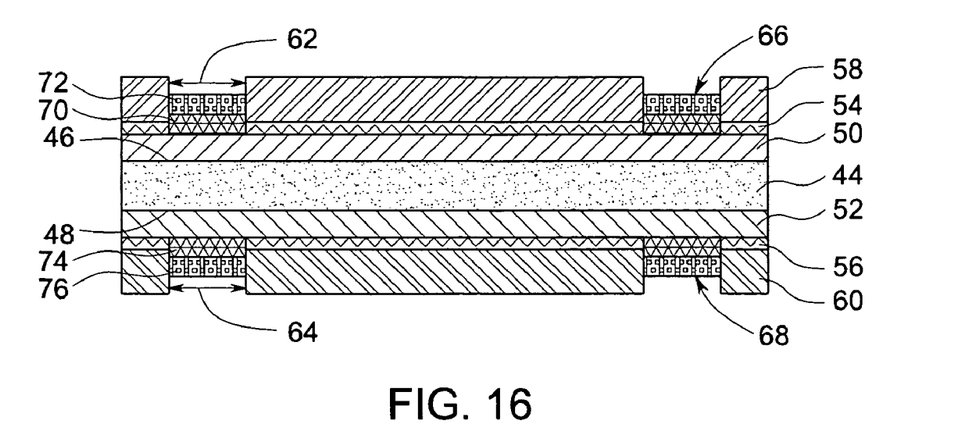

Next, as illustrated in FIG. 14, pattern transfer masks 58 and 60, similar to mask 18 (see FIG. 3) may be employed on the protective layers 54 and 56 to pattern the protective layers. The pattern transfer masks 58 and 60 may then be patterned to form openings 62 and 64 as illustrated in FIG. 15. Subsequently, the underlying protective layers 54 and 56 may be etched to form openings 78 and 80 in the protective layers 54 and 56, respectively. Next, contact pads 66 and 68 may be disposed in the openings 78 and 80. As described above with regard to FIG. 5, the contact pads 66 and 68 may be formed in the openings 78 and 80 by employing techniques, such as lithography or electrolytic plating. As illustrated, the contact pads 66 and 68 may include two or more layers. For example, the contact pads 66 formed on the conductive layer 50 may include first and second layers 70 and 72. In an exemplary embodiment, the first layer 70 may include nickel, and the second layer 72 may include gold. Similarly, for contact pads 68 formed on the conductive layer 52, the first layer 74 may include nickel and the second layer 76 may include gold.

Figure 17:
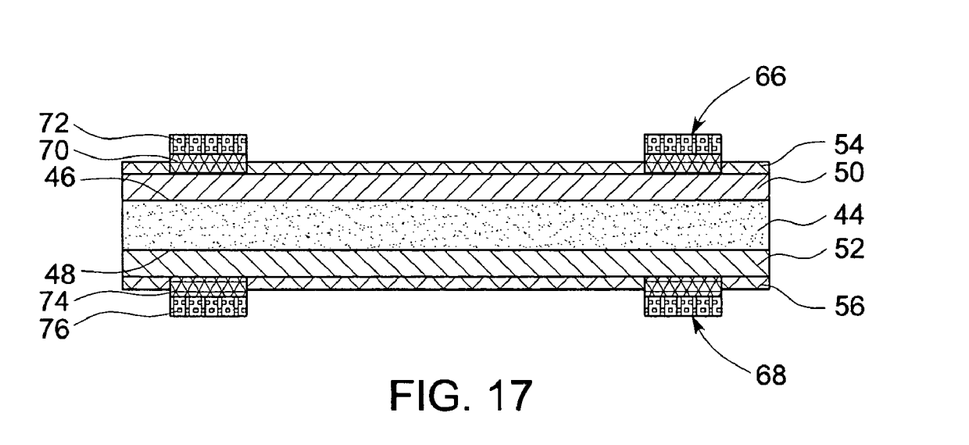

As with FIG. 6, in FIG. 17 the pattern transfer masks 58 and 60 are removed to provide the contact pads 66 and 68 on the conductive layers 50 and 52, respectively. Subsequently, the surface of the contact pads 66 and 68 and the protective layers 54 and 56 may be cleaned to remove any undesirable substances, such as organic materials.

Figure 18:
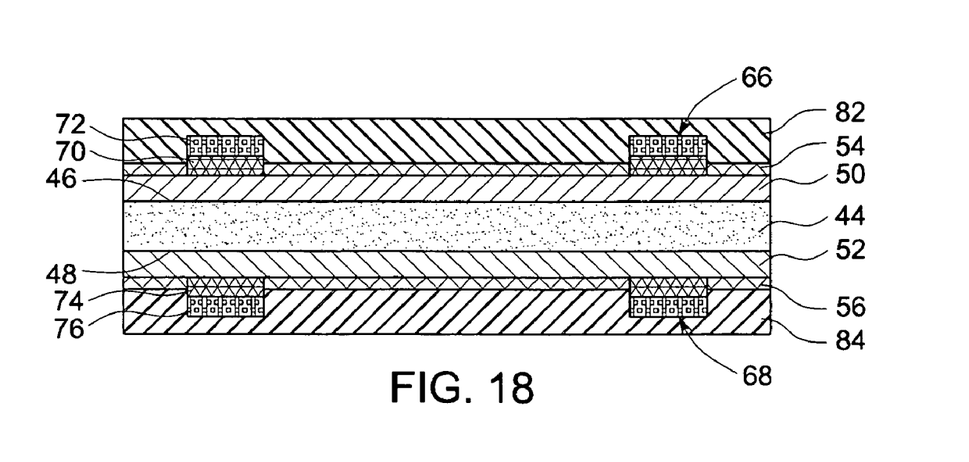
Figure 19:
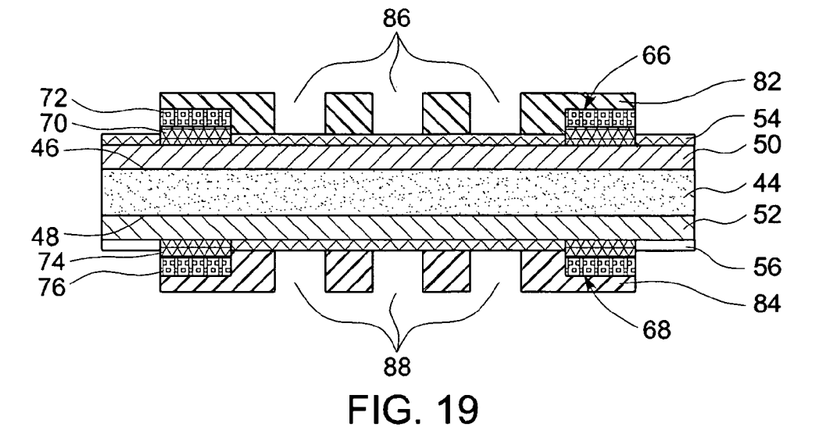

Subsequent to deposition of contact pads 66 and 68 on the conductive layers 50 and 52, the masks 78 is removed and the pattern transfer masks 82 and 84 are employed as illustrated in FIG. 18. The pattern transfer masks 82 and 84 may be similar to the pattern transfer mask 32 of FIG. 7. As with the illustrated embodiment of FIG. 8, in FIG. 19, the pattern transfer masks 82 and 84 are patterned to expose the portions of the protective layers 54 and 56 through openings 86 and 88.

Figure 20:
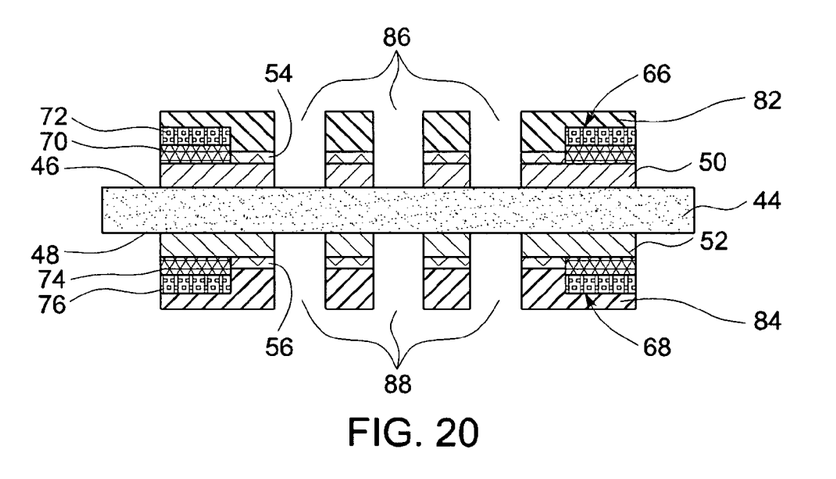

Subsequently, as illustrated in FIG. 20, the conductive layers 50 and 52 in the openings 86 and 88 may be etched to expose portions of the substrate surfaces 46 and 48 respectively. As discussed above, with regard to FIG. 8, the metals layers 50 and 52 may be etched by employing etchants, such as TFT, or ferric chloride, or both, as discussed above with regard to FIG. 9.

Figure 21:
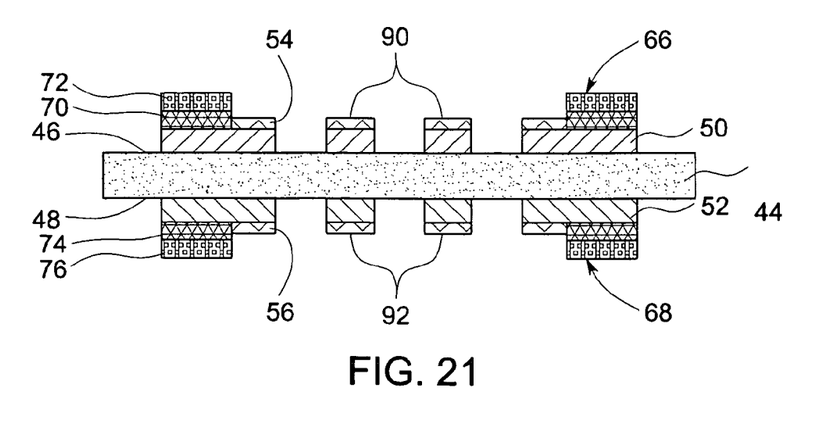

Next, the masks 82 and 84 are removed to provide a substrate 44 having a plurality of electrical traces 90 and 92, and the contact pads 66 and 68 disposed thereon as illustrated in FIG. 21.

Figure 22:
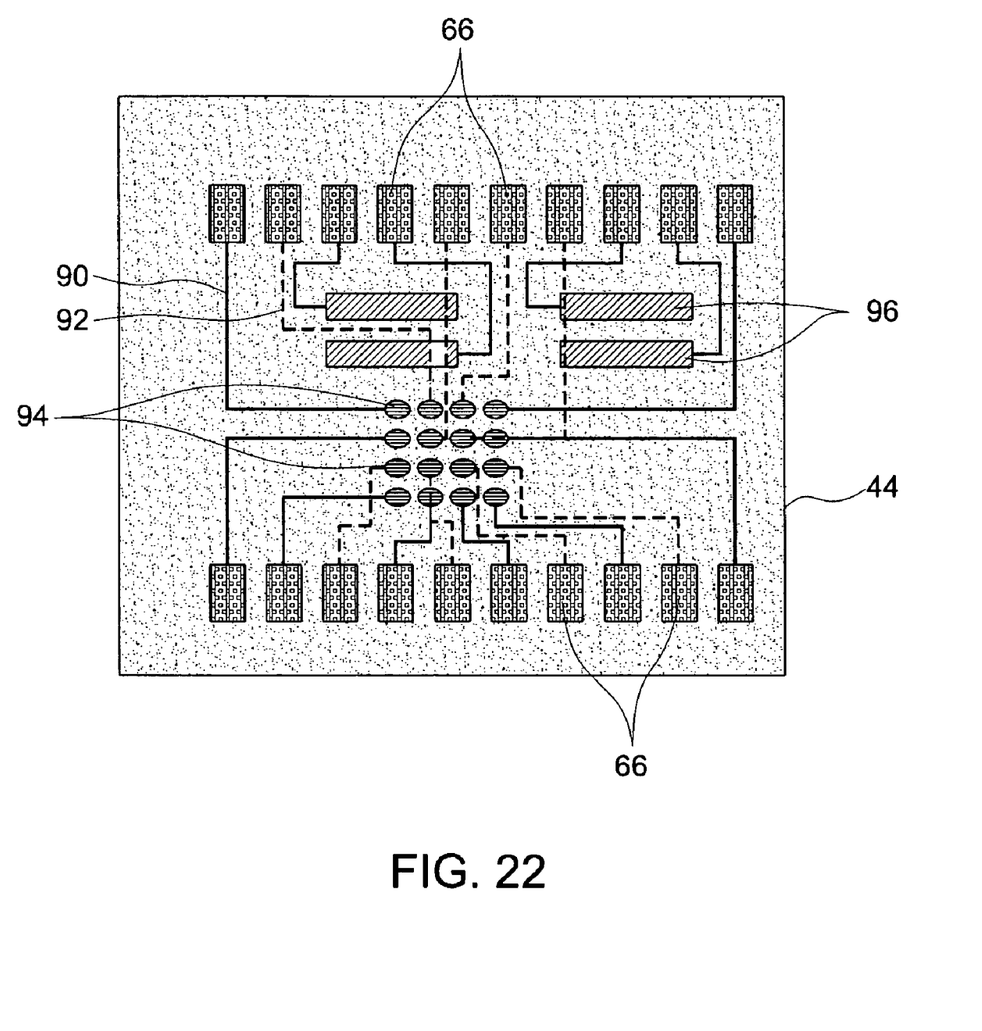
FIG. 22 is a top view of an exemplary interconnect fabricated in accordance with the exemplary method described with reference to FIGS. 12-21.

FIG. 22 illustrates a top view of the embodiment illustrated in FIG. 21 as viewed from the side of the surface 46. As with embodiments illustrated in FIGS. 10 and 11, the substrate 44 may not include bus lines routing to a common bus. Further, the substrate 44, as illustrated in FIG. 22 may include BGA pads 94 and soldering pads 96.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:
1. A method for making an interconnect, comprising:
depositing a conductive layer on a substrate;
depositing an oxidation protective layer on the conductive layer;
patterning the oxidation protective layer to form openings to the conductive layer;

depositing contact pads on the conductive layer through the openings in the oxidation protective layer, the contact pads comprising a conductive material; and patterning the conductive layer and the oxidation protective layer to form electrical traces on the substrate, wherein the conductive layer includes the contact pads deposited thereon.

2. The method of claim 1, wherein the oxidation protective layer comprises one of titanium, tungsten, nickel, molybdenum, chromium, a nickel alloy, or combinations thereof.

3. The method of claim 1, wherein the oxidation protective layer comprises a plurality of layers.

4. The method of claim 1, wherein the substrate comprises a flexible material.

5. The method of claim 1, further comprising depositing an adhesion promoting coating on the substrate prior to depositing the conductive layer.

6. The method of claim 5, wherein the adhesion promoting layer comprises titanium, nickel, molybdenum, chromium, tungsten, a nickel alloy, or combinations thereof.

7. The method of claim 1, wherein the step of depositing the contact pads does not employ bus plating.

8. The method of claim 1, wherein the step of depositing the contact pads comprises:

disposing a mask over the conductive layer to expose contact pad locations of the conductive layer;

etching the oxidation protective layer from the contact pad locations to deposit the contact pads; and depositing a conductive material on the contact pad locations to form the contact pads.

9. The method of claim 8, wherein the step of depositing the conductive material comprises:

depositing a first layer comprising a first material on the conductive layer; and depositing a second layer comprising a second material on the first layer, wherein the second layer comprises a noble metal.

10. The method of claim 9, wherein the first material comprises nickel and wherein the second material comprises gold, or palladium, or both.

11. The method of claim 1, wherein the step of patterning the conductive layer and the oxidation protective layer comprises:

disposing a mask on the oxidation protective layer to provide openings to the protective layer; and removing portions of the conductive layer and the oxidation protective layer to form electrical traces on the substrate.

12. A method for making an interconnect, comprising:

providing a substrate having a first surface and a second surface;

depositing conductive layers on each of the first and second surfaces of the substrate;

depositing oxidation protective layers on each of the conductive layers;

patterning the oxidation protective layers to form openings to the conductive layers;

depositing contact pads on each of the conductive layers through the openings in the oxidation protective layers, the contact pads comprising a conductive material; and patterning each of the conductive layers to form electrical traces on each of the first and second surfaces of the substrate, wherein each of the conductive layers comprises the contact pads deposited thereon.

13. The method of claim 12, further comprising forming an opening in the substrate, wherein the opening extends through a thickness of the substrate.

* * * * *